United States Patent [19]

Ogou

[11] Patent Number: 5,493,253
[45] Date of Patent: Feb. 20, 1996

[54] IC HAVING AN OUTPUT SIGNAL AMPLITUDE KEPT CONSTANT AGAINST TEMPERATURE VARIATION

[75] Inventor: Shin-ichi Ogou, Tokyo, Japan

[73] Assignee: NEC Corporation, Japan

[21] Appl. No.: 315,107

[22] Filed: Sep. 29, 1994

[30] Foreign Application Priority Data

Sep. 30, 1993 [JP] Japan .................................. 5-244180

[51] Int. Cl.⁶ ...................................................... H03F 3/45
[52] U.S. Cl. .......................... 330/256; 330/253; 330/261
[58] Field of Search .................................... 330/253, 256, 330/261

[56] References Cited

PUBLICATIONS

Le, "Autobiasing and Dynamic Range Maximazation in a Greyscale Differential Amplifier", *IBM Technical Disclosure Bulletin*, vol. 27, No. 1A Jun. 1984, pp. 164–165.

*Primary Examiner*—James B. Mullins
*Attorney, Agent, or Firm*—Ostrolenk, Faber, Gerb & Soffen

[57] ABSTRACT

In an integrated circuit having first (VDD) and second (GND) power terminals, a differential amplifier has a load end connected to the first power terminal to produce-in response to an input signal (IN(1)–IN(2)) an output signal (OUT(1)–OUT(2)) when a common connected end of the amplifier is connected through an n-type constant current transistor (19) to the second power terminal. Connected between the power terminals, a bias resistor (25) and an n-type bias transistor (27) produces a bias circuit output voltage for comparison with a reference voltage (REF) by a voltage comparator (29) for producing a difference voltage which is delivered to a constant current transistor gate electrode and fed back to a bias transistor gate electrode to keep an amplitude of the output signal constant against a temperature variation. It is possible to use as the reference voltage a divided voltage of a source voltage supplied between the power terminals. If p-type transistors are used, the source voltage should have a reversed polarity.

4 Claims, 2 Drawing Sheets

IC HAVING AN OUTPUT SIGNAL AMPLITUDE KEPT CONSTANT AGAINST TEMPERATURE VARIATION

BACKGROUND OF THE INVENTION

This invention relates to a semiconductor integrated circuit (IC) comprising a differential amplifier and to a differential amplifier for use in an integrated circuit. The differential amplifier is for producing responsive to an input signal an output signal with an output signal amplitude stabilized against a variation in temperature.

In the manner later described in greater detail, a conventional differential amplifier of this type comprises a pair of transistors connected to a first power terminal through a pair of load resistors and is accompanied by a stabilizing circuit which comprises a constant current transistor supplied with a gate bias voltage kept constant against a temperature variation to stabilize an output signal amplitude of the amplifier against the temperature variation. The output signal amplitude, however, depends on temperature characteristics of the pair of load resistors and of the constant current transistor and is not kept sufficiently constant when the temperature variation is present. The conventional differential amplifier has therefore been defective when it is necessary to keep the output signal amplitude constant against the temperature variation.

SUMMARY OF THE INVENTION

It is consequently an object of the present invention to provide a semiconductor integrated circuit which comprises a differential amplifier for producing responsive to an input signal an output signal of an output signal amplitude kept constant against a temperature variation.

It is another object of this invention to provide an integrated circuit which is of the type described, in which the differential amplifier comprises a pair of transistors connected to a first power terminal through a pair of load resistors and is accompanied by a constant current transistor connected between a point of common connection of the pair of transistors and a second power terminal and supplied with a gate bias voltage kept constant irrespective of a variation in temperature, and in which the output signal amplitude is kept constant despite temperature characteristics of the load resistors and of the constant current transistor.

It is a different object of this invention to provide a differential amplifier which is for use in a semiconductor integrated circuit having first and second power terminals supplied with electric power therebetween and which is for producing responsive to an input signal an output signal with an output signal amplitude kept constant against a temperature variation.

It is another different object of this invention to provide a differential amplifier which is of the type described, comprises a pair of transistors connected to the first power terminal through a pair of load resistors, and is accompanied by a constant current transistor connected between a point of common connection of the pair of transistors and the second power terminal and supplied with a gate bias voltage kept constant against a temperature variation, and in which the output signal amplitude is kept constant despite temperature characteristics of the load resistors and of the constant current transistor.

Other objects of this invention will become clear as the description proceeds.

In accordance with an aspect of this invention, there is provided a semiconductor integrated circuit responsive to an input signal for producing an output signal, comprising: (A) a differential amplifier comprising a pair of transistors having source or drain electrodes common connected at a point of common connection, gate electrodes, and drain or source electrodes connected to a pair of load resistors at points of connection and through the load resistors to a first power terminal, the input signal being supplied across the gate electrodes, (B) a constant current transistor having a constant current transistor gate electrode and connected between the point of common connection and a second power terminal. (C) bias means for supplying a bias voltage to the constant current transistor gate electrode, and (D) means for supplying electric power between the first and the second power terminals to make the differential amplifier produce the output signal between the points of connection, wherein the bias means comprises: (Ca) a bias circuit connected between the first and the second power terminals and producing a bias circuit output voltage; and (Cb) a voltage comparator responsive to a predetermined reference voltage for producing a difference voltage between the bias circuit output voltage and the reference voltage to deliver the difference voltage to the constant current transistor gate electrode as the bias voltage and to feed back the difference voltage to the bias circuit to control a current flowing through the bias circuit.

In accordance with a different aspect of this invention, there is provided a combination of (A) a differential amplifier having a load end and a common connected end for use in a semiconductor integrated circuit having a first and a second power terminal supplied with electric power therebetween with the first power terminal connected to the load end and (B) stabilizing means connected between the common connected end and the second power terminal to make the differential amplifier produce in response to an input signal an output signal having an amplitude for stabilizing the amplitude against a temperature variation, the differential amplifier comprising a pair of transistors having source or drain electrodes common connected at the common connected end, gate electrodes supplied with the input signal thereacross, and drain or source electrodes connected to a pair of load resistors at points of connection and through the load resistors to the first power terminal at the load end to produce the output signal between the points of connection, the stabilizing means comprising (Ba) a constant current transistor having a constant current gate electrode and connected between the common connected end and the second power terminal and (Bb) bias means for supplying a bias voltage to the constant current transistor gate electrode, wherein the bias means comprises: (BbA) a bias circuit connected between the first and the second power terminals and producing a bias circuit output voltage; and (BbB) a voltage comparator responsive to a predetermined reference voltage for producing a difference voltage between the bias circuit output voltage and the reference voltage to deliver the difference voltage to the constant current transistor gate electrode as the bias voltage and to feed back the difference voltage to the bias circuit to control a current flowing through the bias circuit.

In each of two aspects set forth in the foregoing, the reference voltage is preferably given by dividing a source voltage of the electric power. Alternatively, it is possible to give the reference voltage by manual adjustment.

DESCRIPTION OF THE PREFERRED EMBODIMENTS

Figure 1:
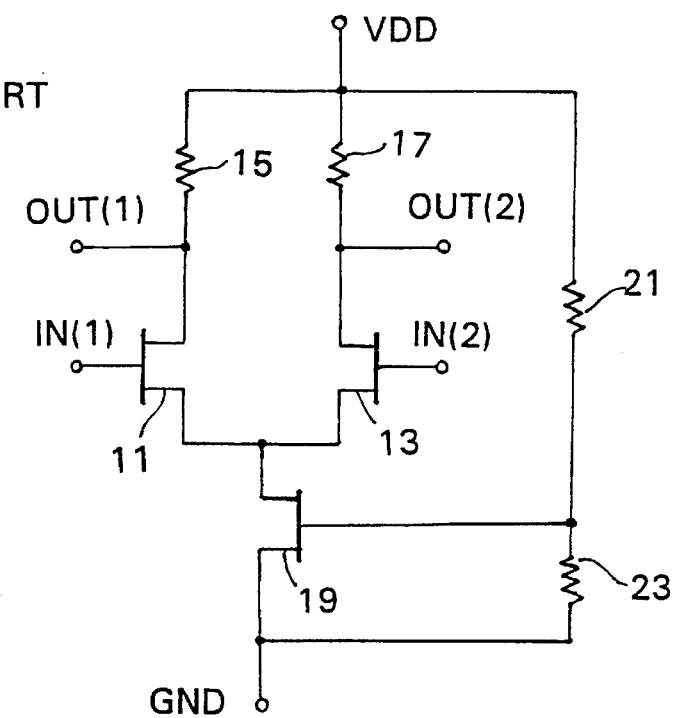
FIG. 1 is a circuit diagram of a semiconductor integrated circuit according to prior art.

Referring to FIG. 1 a conventional semiconductor integrated circuit (IC) will first be described in order to facilitate an understanding of the present invention. It will be presumed for the time being that transistors are n-type gallium arsenide (GaAs) field effect transistors (FET) unless otherwise specifically mentioned.

The integrated circuit has a first power terminal VDD and a second power terminal GND. Electric power of a source voltage is supplied between the first and the second power terminals. The second power terminal is usually grounded. The electric power therefore keeps the first and the second power terminals at a positive and a ground potential.

In the integrated circuit, a differential amplifier comprises a pair of first and second transistors 11 and 13 having source electrodes common connected at a point of common connection, namely, at a common connected end. Across gate electrodes of the first and the second transistors 11 and 13, an input signal is supplied in the manner indicated at IN(1) and IN(2). Drain electrodes of the first and the second transistors 11 and 13 are connected to a pair of first and second load resistors 15 and 17 at points of connection and to the first power terminal through the load resistors 15 and 17 at a load end of the differential amplifier.

A constant current transistor 19 has a constant current transistor gate electrode and is connected between the point of common connection and the second power terminal. First and second divider resistors 21 and 23 are connected in series at a point of series connection between the first and the second power terminals to produce a divided voltage at the point of series connection. The divided voltage is delivered to the constant current transistor gate electrode as a gate bias voltage. An output signal is produced between the points of connection as indicated at OUT(1) and OUT(2) in polarity reversed correspondence to IN(1) and IN(2).

The output signal has an output signal amplitude which is determined by resistance values of the load resistors 15 and 17 and by a constant current value flowing through the constant current transistor 19 and branched at the point of common connection to flow through the first and the second transistors 11 and 13. Inasmuch as the gate bias voltage is given by the divided voltage which is kept constant against a temperature variation, the constant current is stabilized irrespective of a variation in temperature. As a consequence, the output signal amplitude is stabilized against the temperature variation.

It should, however, be noted that the constant current transistor 19 has a temperature characteristic. The lead resisters 15 and 17 also have temperature characteristics. Combined with the temperature characteristic of the constant current transistor 19, the temperature characteristics of the lead resisters 15 and 17 give rise to a variation in the output signal amplitude dependent on a variation in temperature. This is objectionable when the output signal amplitude should be kept invariable despite the variation in temperature.

Figure 2:
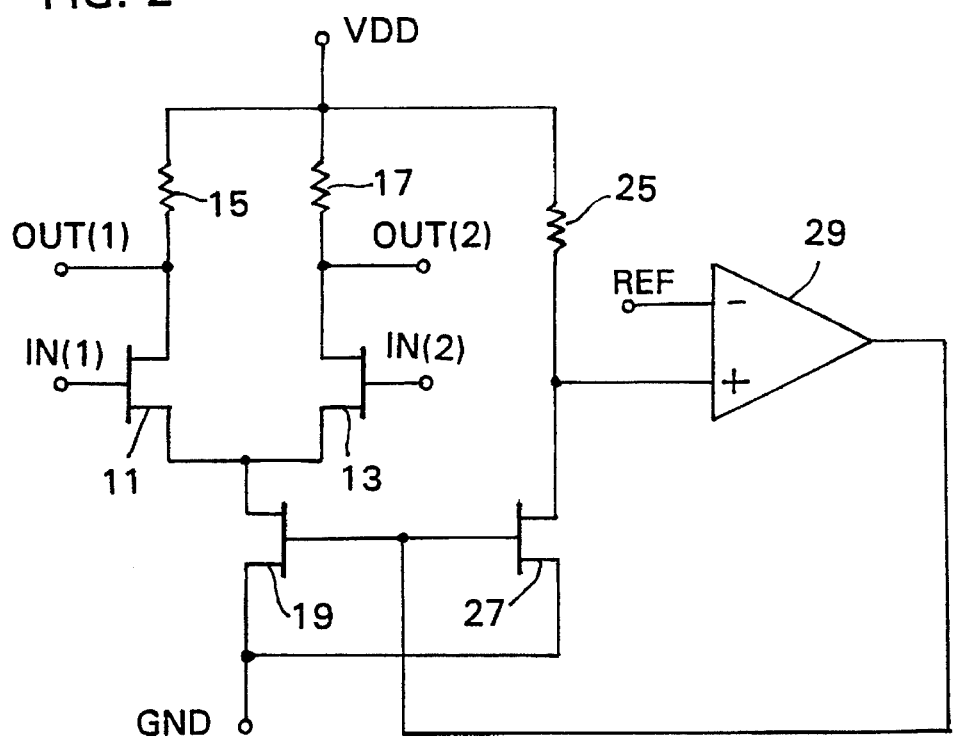
FIG. 2 is a circuit diagram of a semiconductor integrated circuit according to a first embodiment of the instant invention.

Referring now to FIG. 2, the description will proceed to a semiconductor integrated circuit according to a first embodiment of this invention. Transistors are n-type gallium arsenide field effect transistors as in FIG. 1. The integrated circuit has first and second power terminals and comprises a differential amplifier accompanied by a constant current transistor. Similar parts are designated by like reference numerals and are similarly operable with likewise named signals.

In FIG. 2, a series connection of a bias resistor 25 and a bias transistor 27 is substituted collectively as a bias circuit for the divider resisters 21 and 23 described in conjunction with FIG. 1. More particularly, the bias resistor 25 has one end connected to the first power terminal and another end. The bias transistor 27 has a bias transistor gate electrode and is connected to the other end of the bias resistor 25 at a point of bias circuit connection and to the second power terminal. The bias circuit (25, 27) produces a bias circuit output voltage at the point of bias circuit connection.

An operational amplifier 29 is used as a voltage comparator and has a plus or noninverted input terminal, a minus or inverted input terminal, and an amplifier output terminal. The voltage comparator will be designated also by the reference numeral 29. A predetermined reference voltage REF is supplied to the minus input terminal. The bias circuit output voltage is delivered to the plus input terminal. Comparing the bias circuit output voltage with the reference voltage, the voltage comparator 29 produces a difference voltage with amplification at the amplifier output terminal.

The difference voltage is delivered to the constant current transistor gate electrode of the constant current transistor 19 as the gate bias voltage in place of the divided voltage described in connection with FIG. 1. Furthermore, the difference voltage is fed back to the bias transistor gate electrode of the bias transistor 27 as a gate control voltage. As a result, the difference voltage controls the constant current of the constant current transistor 19 and consequently electric currents flowing through the first and the second transistors 11 and 13 and through the load resistors 15 and 17. In addition, the difference voltage controls an electric current flowing through the bias circuit as will be described in the following.

It will first be presumed that the temperature varies to reduce the bias circuit output voltage of the bias circuit (25, 27) below the reference voltage REF. In this event, the voltage comparator 29 produces the difference voltage with a lower level. This reduces a gate/source voltage of the bias transistor 27 to render the bias circuit output voltage equal to the reference voltage.

It will next be presumed that the temperature varies to raise the bias circuit output voltage above the reference voltage. In this case, the voltage comparator 29 produces the difference voltage with a higher level to raise the gate/source voltage of the bias transistor 27 and to again render the bias circuit output voltage equal to the reference voltage.

in this manner, the difference voltage controls the gate/source voltage of the bias transistor 27 to keep the bias circuit output voltage always equal to the reference voltage irrespective of the variation in temperature. The difference voltage is sent concurrently to the constant current transistor gate electrode. The constant current of the constant current transistor 19 is consequently controlled to keep a constant current value despite the temperature variation, to suppress a variation in the output signal amplitude, and to keep the output signal amplitude constant against the temperature variation.

On analytically describing the foregoing, it will be surmised that the load resistors 15 and 17 and the bias resistor 25 have a temperature characteristic in common and that the constant current and the bias transistors 19 and 27 have a common temperature characteristic. In order to study a variation in the output signal amplitude, attention will be directed to an output signal voltage which the output signal has at a first point of connection OUT(1) between the first transistor 11 and the first load resistor 15. This output voltage will be denoted by V1.

In addition, symbols will be used as follows.

The bias circuit output voltage: Vb;

The first load resistor 15 has a first load resistance value R1 and a resistor temperature coefficient Kr;

The bias resistor 25 has a bias resistance value

The constant current of the constant current transistor 19 has a constant current value Ic and a transistor temperature coefficient Kt;

Through the bias transistor 27, a bias current flows with a bias current value Ib;

A variation caused in the gate current of the constant current transistor 19: k;

A ratio which the bias current has in the constant current: m: and A ratio of the bias resistance value in the first load resistance value: n.

Under the circumstances:

$$V1 = (kKtIc)(KrR1); \quad (1)$$

$$kKtIc = kmKtIb;$$

$$Ic = mIb;$$

$$KrR1 = nKrBb;$$

$$R1 = mnRb; \quad 40$$

and $$Vb = (kKTIb)(KrRb). \quad (2)$$

As a result of feed back of the difference voltage to the bias transistor 27, the bias circuit output voltage Vb of Equation (2) becomes equal to a constant C which is independent of the variation in temperature. Therefore:

$$k = C/(KrKt). \quad (3)$$

Substituting Equation (3) into Equation (1):

$$V1 = CIcR1. \quad (4)$$

Equation (4) shows that the output voltage V1 is decided by the load resistance value R1 of the first load resistor 15 and the constant current value Ic of the constant current transistor 19 and is kept constant irrespective of the variation in temperature. Similarly, the output voltage at a second point of connection OUT(2) is kept constant despite the temperature variation. After all, the output signal amplitude is kept constant against the temperature variation.

Figure 3:
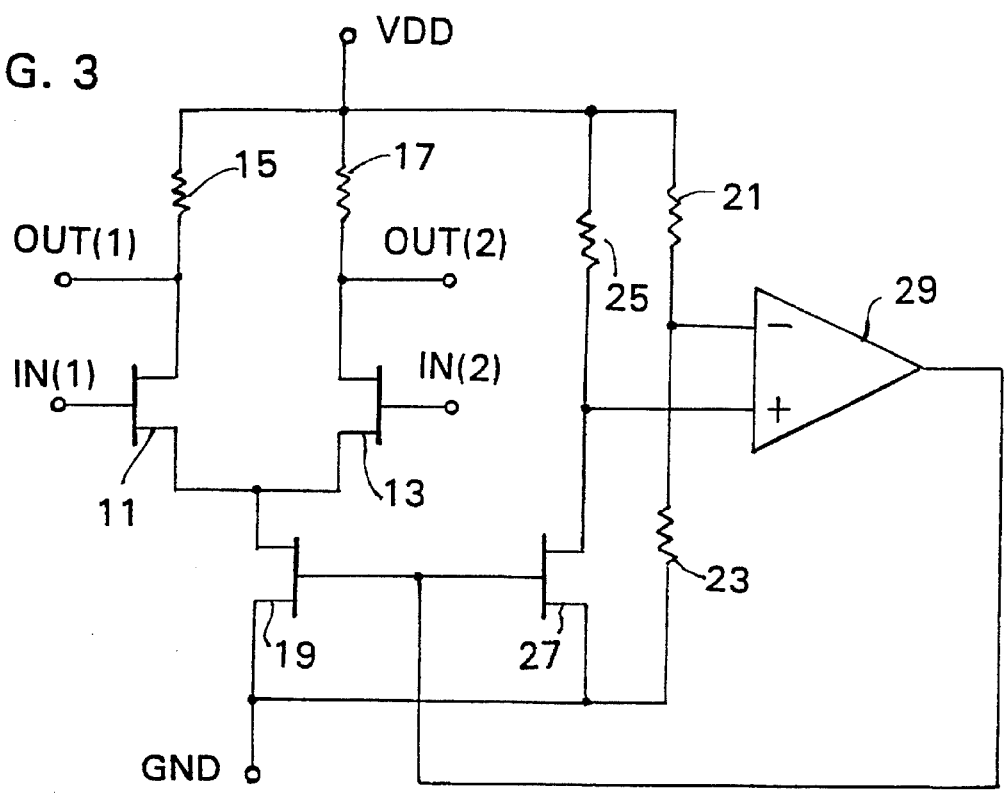
FIG. 3 is a circuit diagram of a semiconductor integrated circuit according to a second embodiment of this invention.

Turning to FIG. 3, attention will be directed to a semiconductor integrated circuit according to a second embodiment of this invention. Transistors are again n-type gallium arsenide field effect transistors. Similar parts are designated by like reference numerals.

In FIG. 3, the bias circuit further comprises a divider circuit in which the first and the second divider resistors 21 and 23 are connected in series at the point of series connection between the first and the second power terminals as in FIG. 1. The divided voltage is, however, not delivered directly to the constant current transistor gate electrode of the constant current transistor 19. Instead, the divided voltage is delivered to the voltage comparator 29 as the reference voltage for comparison with the bias circuit output voltage sent from the point of bias circuit connection between the bias resistor 25 and the bias transistor 27.

It is obvious that the illustrated integrated circuit is operable with the salient features described in connection with FIG. 2. Incidentally, it is possible in FIG. 2 to manually adjust, as empirically, the reference voltage for supply to the voltage comparator 29.

Figure 4:
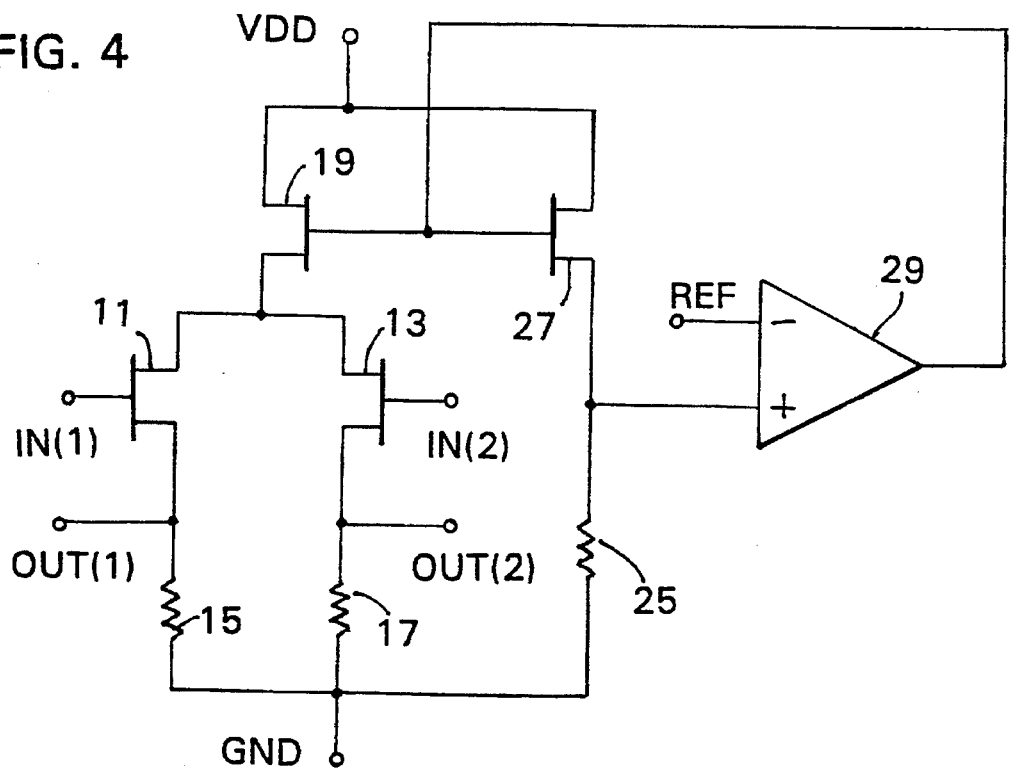
FIG. 4 is a circuit diagram of a semiconductor integrated circuit according to a third embodiment of this invention.

Referring to FIG. 4, a semiconductor integrated circuit is similar in structure according to a third embodiment of this invention. In contrast to the integrated circuits illustrated with reference to FIGS. 1 through 3, p-type gallium arsenide field effect transistors are used. Accordingly, the first power terminal is supplied with a negative voltage (VDD) relative to the ground potential (GND) given to the second power terminal. It is clearly possible with the integrated circuit of FIG. 4 to achieve similar technical merits as those attained by the integrated circuits illustrated with reference to FIGS. 2 and 3. Depending on circumstances, it is convenient to understand in FIG. 4 that the first power terminal is connected to the load end of the differential amplifier like in FIGS. 1 through 3 and is supplied with the ground potential with the second power terminal connected to the stabilizing circuit and supplied with the negative voltage. In FIGS. 2 through 4, use is possible of transistors of other types.

What is claimed is:

1. A semiconductor integrated circuit, comprising:

first and second input terminals;

first, second, third and fourth nodes;

first and second power lines;

a first output terminal connected to said first node;

a first transistor having a source-drain path connected between said first and third nodes and having a gate connected to said first input terminal;

a second transistor having a source-drain path connected between said second and third nodes and having a gate connected to said second input terminal;

a first resistor connected between said first power line and said first node;

a second resistor connected between said first power line and said second node;

a third transistor having a source-drain path connected between said third node and said second power line and having a gate;

a third resistor connected between said first power line and said fourth node;

a fourth transistor having a source-drain path connected between said fourth node and said second power line and having a gate connected to the gate of said third transistor; and an operational amplifier having a non-inverting input node connected directly to said fourth node, an inverting input node provided with a reference voltage, and an output node connected to the gate of said third transistor.

2. The circuit as claimed in claim 1, further comprising a second output terminal connected to said second node.

3. The circuit as claimed in claim 1, wherein said reference voltage is generated from a connection node of fourth and fifth resistors which are connected in series between said first and second power lines.

4. The circuit as claimed in claim 1, wherein each of said first, second, third and fourth transistors is a gallium arsenide field effect transistor.

* * * * *